(12) United States Patent
Chilton

(10) Patent No.: US 7,865,761 B1
(45) Date of Patent: Jan. 4, 2011

(54) ACCESSING MULTIPLE NON-VOLATILE SEMICONDUCTOR MEMORY MODULES IN AN UNEVEN MANNER

(75) Inventor: Kendell Chilton, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 677 days.

(21) Appl. No.: 11/823,499

(22) Filed: Jun. 28, 2007

(51) Int. Cl.
*G06F 13/00* (2006.01)

(52) U.S. Cl. .................. 714/2; 714/6; 714/7; 711/103; 711/5; 711/118; 711/114; 711/143

(58) Field of Classification Search .............. 711/103, 711/118, 114, 143, 5; 714/2, 6, 7
See application file for complete search history.

(56) References Cited

U.S. PATENT DOCUMENTS

| | | | |
|---|---|---|---|
| 7,139,863 B1* | 11/2006 | Defouw et al. .............. 711/103 |
| 7,224,604 B2 | 5/2007 | Lasser | |
| 7,318,117 B2 | 1/2008 | Lee et al. | |
| 7,353,325 B2 | 4/2008 | Lofgren et al. | |
| 7,363,421 B2 | 4/2008 | Di Sena et al. | |
| 2003/0227804 A1* | 12/2003 | Lofgren et al. .............. 365/200 |
| 2004/0210706 A1* | 10/2004 | In et al. ....................... 711/103 |
| 2005/0081048 A1* | 4/2005 | Komarla et al. ............. 713/193 |
| 2006/0203546 A1* | 9/2006 | Lasser ..................... 365/185.09 |
| 2006/0206738 A1* | 9/2006 | Jeddeloh et al. ............. 713/320 |
| 2007/0016719 A1* | 1/2007 | Ono et al. .................... 711/103 |
| 2008/0086585 A1* | 4/2008 | Fukuda et al. .............. 711/100 |
| 2008/0219053 A1* | 9/2008 | Kim ....................... 365/185.11 |

\* cited by examiner

*Primary Examiner*—Hong Kim
(74) *Attorney, Agent, or Firm*—BainwoodHuang

(57) ABSTRACT

A data storage apparatus (e.g., a flash memory appliance) includes a set of memory modules, an interface and a main controller coupled to the each memory module and to the interface. Each memory module has non-volatile semiconductor memory (e.g., flash memory). The interface is arranged to communicate with a set of external devices. The main controller is arranged to (i) store data within and (ii) retrieve data from the non-volatile semiconductor memory of the set of memory modules in an uneven manner on behalf of the set of external devices to unevenly wear out the memory modules over time. Due to the ability of the data storage apparatus to utilize each memory module through its maximum life and to stagger the failures of the modules, such a data storage apparatus is well-suited as a high availability storage device, e.g., a semiconductor cache for a fault tolerant data storage system.

20 Claims, 5 Drawing Sheets

ACCESSING MULTIPLE NON-VOLATILE SEMICONDUCTOR MEMORY MODULES IN AN UNEVEN MANNER

BACKGROUND

A typical magnetic disk drive includes, among other things, (i) magnetic platters (i.e., disks) which rotate about a common spindle, and (ii) heads which write information to and read information from the magnetic platter surfaces. Over time, the possibility exists that such a magnetic disk drive suffers a failure due to the heads hovering over the same areas on the platter surfaces for a long period of time. To avoid such a failure, some conventional disk drives periodically move their heads to different tracks (e.g., every 15 seconds) so that the heads do not sit over the same areas on the platter surfaces for very long. This type of operation is commonly known as "wear leveling".

A similar dilemma and resolution exists with flash memory. That is, flash memory cells can only be put through a finite number of erase cycles before wearing out and becoming statistically unreliable (e.g., after 1,000,000 write cycles). To prevent only a section of a flash memory card from wearing out and rendering the entire flash memory card in need of replacement, wear leveling is commonly applied to flash memory cards as well.

One conventional scheme to wear leveling flash memory involves writing to unused or rarely used sections of flash memory before re-writing to often-used sections of the flash memory. That is, when a flash memory controller on a flash memory card writes information to the flash memory on the card, the controller identifies a group of blocks from an unused block pool and writes the information to that group of blocks. If the controller then needs to update that information, the controller (i) identifies a new group of blocks from the unused block pool and writes the information to that new group of blocks, and (ii) erases the initial group of blocks and returns the initial group of blocks to the unused block pool. On occasion, the flash memory controller may recognize a group of blocks which contain data that has not been modified often and move this unmodified data to a more worn-out block and place the initial lightly worn block into the unused block pool. Accordingly, the controller carries out wear leveling on the flash memory of the flash memory card thus evenly distributing erase operations across the entire flash memory.

SUMMARY

It should be understood that there are deficiencies to the application of conventional wear leveling schemes to multiple flash memory cards. For example, suppose that the main (or primary) memory of a computer system is formed by the aggregation of several flash memory cards. Furthermore, suppose that the computer system applies a conventional wear leveling scheme to the flash memory cards by purposefully writing to each flash memory card at the same frequency. In this example, the computer system may enjoy a lengthy period of time (e.g., many years) without needing to replace any of the flash memory cards since erase cycles are methodically distributed over all of the flash memory cards. Then, at some point, the flash memory cards will reach the end of their useful lives in terms of write cycles, and will require replacement.

Unfortunately, under application of a conventional wear leveling scheme, the flash memory cards will reach the end of their useful lives at around the same time. Near this time, the operator of the computer system must decide whether to (i) change all of the flash memory cards all at once, or (ii) change the flash memory cards individually in response to individual flash memory card failures.

If the operator decides to change the flash memory cards all at once, some flash memory cards may still have the capacity for additional erase cycles and thus not require immediate changing. That is, some flash memory cards may still have several weeks, months or even years of remaining useful life due to variations in the flash memory cards and imbalances between data accesses of the flash memory cards. Accordingly, the operator will be replacing some flash memory cards prematurely, i.e., throwing away good flash memory cards. Furthermore, a complete replacement will likely require the operator to shutdown the computer system thus making the computer system unavailable for a period of time.

On the other hand, if the operator changes the flash memory cards individually in response to individual flash memory card failures (e.g., in order to keep the computer system up and running), the operator will encounter a period of time in which there is a high frequency of flash memory card failures. At a minimum, this period of time will pose a nuisance to the operator by requiring the operator to service the computer system on a very frequent basis, e.g., daily, weekly or monthly after going through several years without having to replace any flash memory cards due to wear. Moreover, it is also quite possible that the computer system could lose multiple flash memory cards (e.g., a first flash memory card and followed by loss of one or more other flash memory cards) before the operator has a chance to replace any flash memory cards. This failure situation may be very undesirable since multiple failures prior to servicing increases the risk that the computer system as a whole will fail in an unplanned manner. Nevertheless, the application of a wear leveling scheme to the flash memory cards encourages this multiple failure situation to occur before servicing takes place.

In contrast to the above-described conventional wear leveling schemes, improved techniques involve purposefully accessing non-volatile semiconductor memory modules (e.g., flash memory cards) in an uneven manner. In some arrangements, a controller writes to the most-written non-volatile semiconductor memory module most often in order to wear that memory module out first. Accordingly, the non-volatile semiconductor memory modules will decisively wear out unevenly over time. Moreover, such a technique enables each non-volatile semiconductor memory module to be worn out to its fullest extent before replacement, i.e., replacement of each memory module occurs only after that memory module fails due to wear. Furthermore, such a technique methodically staggers the expected failure of each non-volatile semiconductor memory module to minimize the chance of encountering a situation in which multiple memory module failures occur before servicing arrives.

One embodiment is directed to a data storage apparatus (e.g., a flash memory appliance). The data storage apparatus includes a set of memory modules, an interface, and a main controller coupled to the each memory module and to the interface. Each memory module has non-volatile semiconductor memory (e.g., flash memory). The interface is arranged to communicate with a set of external devices. The main controller is arranged to (i) store data within and (ii) retrieve data from the non-volatile semiconductor memory in an uneven manner on behalf of the set of external devices to unevenly wear out the memory modules over time. Due to the ability of the data storage apparatus to utilize each memory module through its maximum life and to stagger the failures of the modules, such a data storage apparatus is well-suited as a high availability storage device, e.g., a semiconductor cache for a fault tolerant data storage system. In particular, management of the memory modules in this purposeful uneven manner results in (i) maximization of memory module lifetime and (ii) lowering of the possibility of encountering multiple memory module failures prior to servicing.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

An improved technique involves purposefully accessing non-volatile semiconductor memory modules (e.g., flash memory cards) in an uneven manner. In some arrangements, a controller deliberately writes to the most-written non-volatile semiconductor memory module most often in order to wear that memory module out first. Accordingly, the non-volatile semiconductor memory modules will decisively wear out unevenly over time (i.e., the most-written memory module will clearly wear out ahead of the other memory modules). Moreover, such a technique enables each non-volatile semiconductor memory module to be worn out to its fullest extent before replacement. Furthermore, such a technique staggers the expected failure of each non-volatile semiconductor memory module to minimize the chance of encountering a situation of multiple memory module failures before servicing can arrive.

Figure 1:
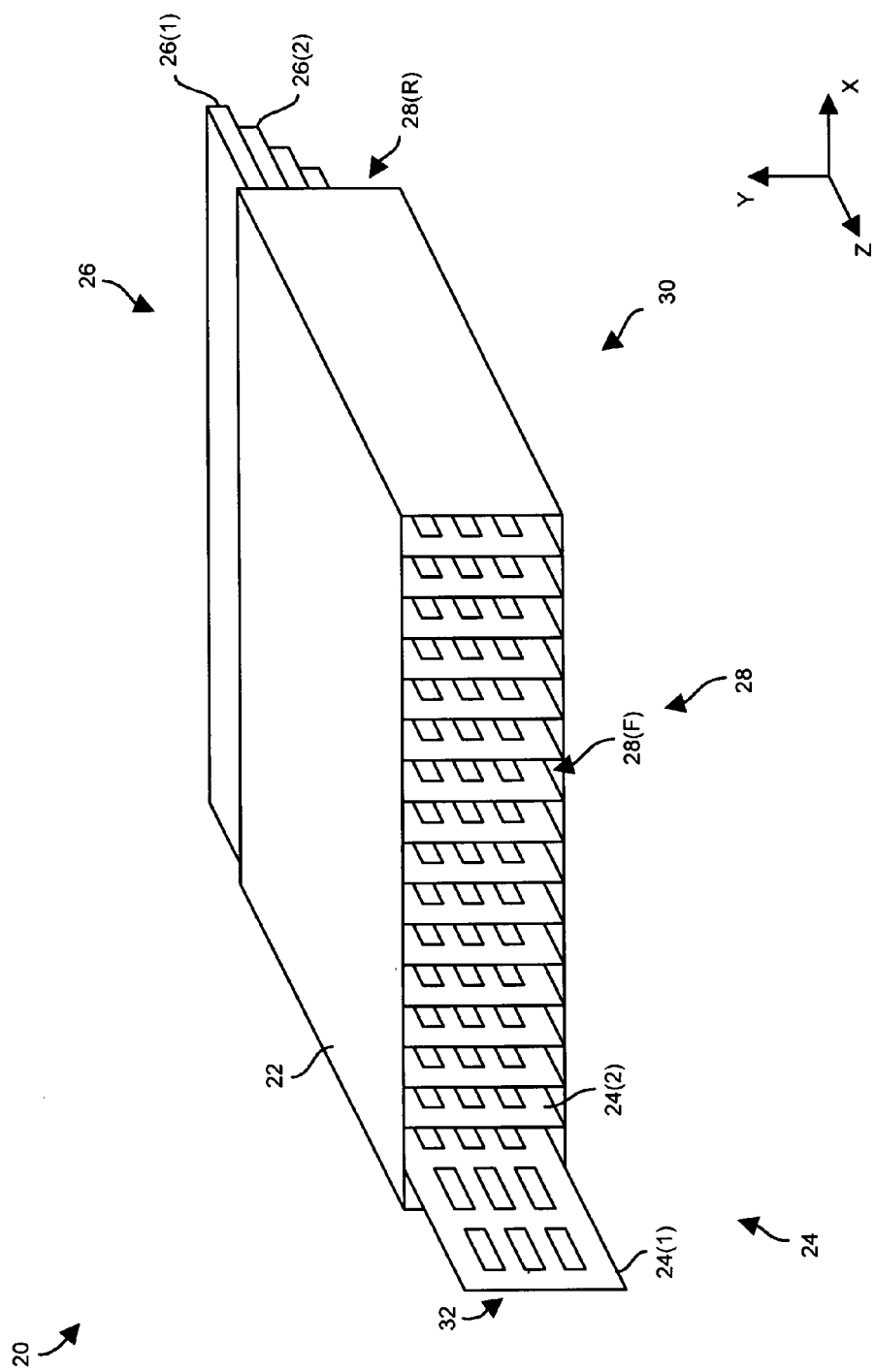
FIG. 1 is a perspective view of a data storage apparatus which is suitable for rack environments.

FIG. 1 shows a perspective view of a data storage apparatus 20 which purposefully accesses non-volatile semiconductor memory modules in an uneven manner. The data storage apparatus 20 includes a rack-mount enclosure 22, multiple non-volatile semiconductor memory modules 24(1), 24(2), . . . (collectively, memory modules 24), and multiple control modules 26(1), 26(2), . . . (collectively, control modules 26). The rack-mount enclosure 22 defines a front opening 28(F) and a rear opening 28(R) (collectively, openings 28). Each memory module 24 installs as a hot-swappable field replaceable unit (FRU) through the front opening 28(F) in the negative Z-direction (e.g., coinciding with a front of an electronic equipment rack). Similarly, each control module 26 installs as a hot-swappable FRU through the rear opening 28(R) in the positive Z-direction (e.g., coinciding with a back of an electronic equipment rack).

Once installed, the memory modules 24 and control modules 26 operate to form a flash storage appliance 30. In particular, and as will be explained in further detail shortly, each control module 26 is capable of storing data into and retrieving data from the non-volatile semiconductor memory module 24 in a deliberate uneven manner. In particular, each control module 26 is arranged to methodically write to a designated memory module 24 which has been selected for overloading (e.g., the memory module 24(1)) significantly more often than the other memory modules 24.

In some arrangements, power supplies and cooling mechanisms (e.g., fans) install either through the front opening 28(F) or the rear opening 28(R). For example, the power supplies and cooling mechanisms can insert into designated slots in through the rear opening 28(R) of the enclosure 22.

In other arrangements, the power supplies and cooling mechanisms reside within the control modules 26 themselves. In such arrangements, the control modules 26 are arranged to monitor consumption and temperature of the memory modules 24 as well as provide a warning signal if the power consumption falls outside a predetermined power range or if the temperature falls outside a predetermined temperate range. By way of example, each memory module 24 is provisioned with a set of LEDs 32 (shown generally in FIG. 1 by the arrow 32) which identifies the operational state (good, bad, etc.) of that particular memory module 24.

Additionally, in some arrangements, the memory modules 24 install in a substantially perpendicular orientation relative to the control modules 26 thus allowing each memory module 24 to connect to a control module 26 without any need of a mid-plane which would otherwise be a potential single point of failure. For example, as shown in FIG. 1, both the memory modules 24 and the control modules 26 are plane-shaped. The memory modules 24 extend substantially in the Y-Z (vertical) plane while the control modules 26 extend substantially in the X-Z (horizontal) plane thus enabling each memory module 24 to connect with an edge portion of each control module 26. The control modules 26 are shown in FIG. 1 as being slightly withdrawn from the enclosure 22 for illustration purposes. Further details will now be provided with reference to FIG. 2.

Figure 2:
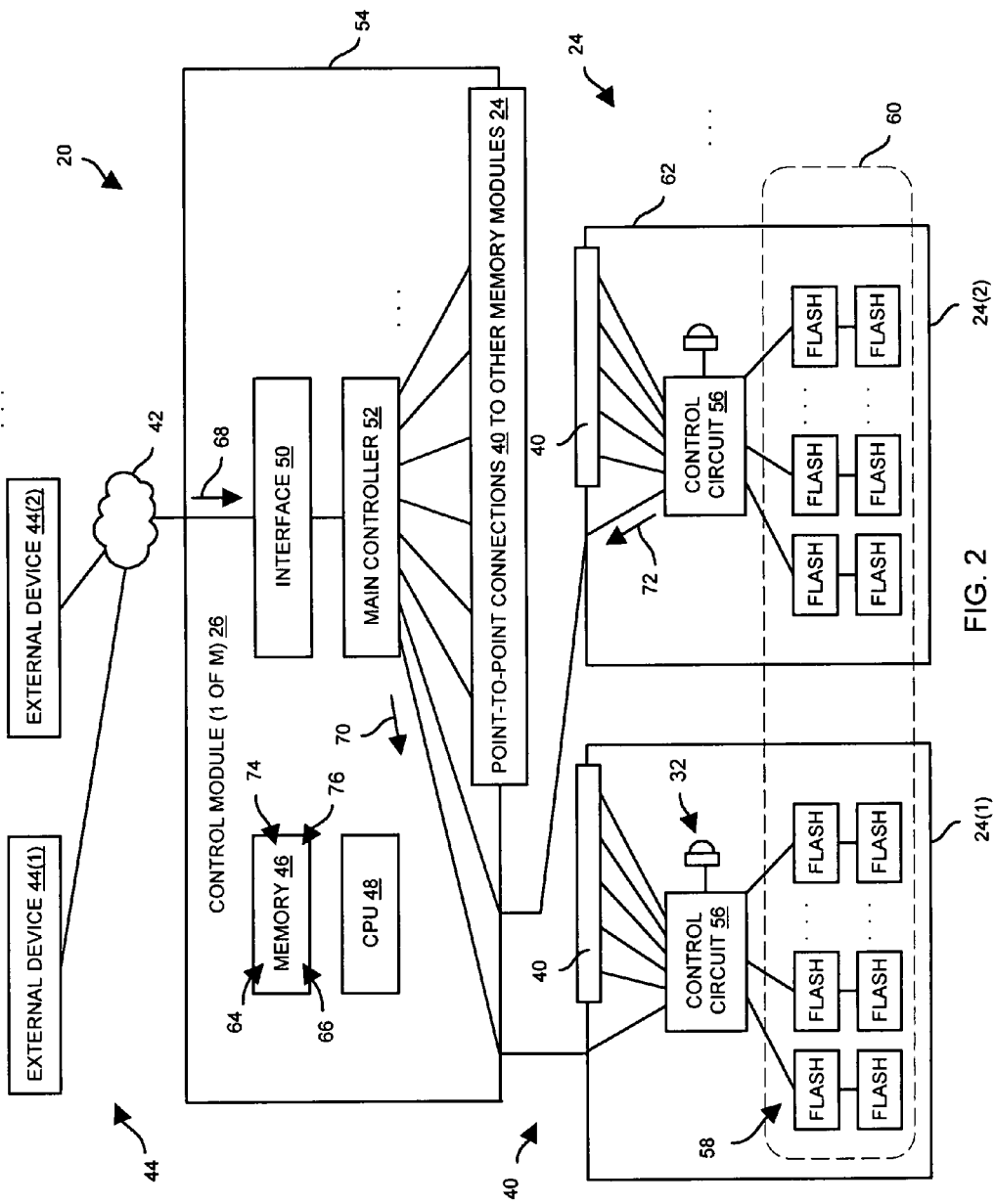
FIG. 2 is a block diagram of particular components of the data storage apparatus of FIG. 1.

FIG. 2 is a block diagram of a portion of the data storage apparatus 20 from the perspective of a control module 26, i.e., one of M control modules 26. The control module 26 connects to each non-volatile semiconductor memory module 24 through respective point-to-point connections 40. Additionally, the control module 26 connects to an external communications medium 42 which enables the control module 26 to reach multiple external devices 44(1), 44(2), . . . (collectively, external devices 44). There may be several outside connections to the external devices 44 but there is at least one connection per main controller 52. As a result of the topology shown in FIG. 2, the control module 26 is capable of accessing each memory module 24 to carry out data storage operations on behalf of the external devices 42. Other control modules 26 (see FIG. 1) are similarly arranged.

The control module 26 includes memory 46, CPU/processing circuitry 48, an interface 50 and a main controller 52. In some arrangements, the memory 46, the CPU/processing circuitry 48, the interface 50 and the main controller 52 reside on a common printed circuit board (PCB) 54.

Additionally, each memory module 24 includes a control circuit 56 and multiple non-volatile semiconductor memory devices 58 (e.g., flash memory integrated circuit devices) which form a memory space 60 which the control module 26 maps to a logical memory space (e.g., for logical block addressing). Such mapping enables the control module 26 to deal with replacement of the memory modules 24 without loss of contiguous space or data. The control circuit 56 is arranged to present the non-volatile semiconductor memory as a generic medium but nevertheless indicates specific attributes about the memory if queried (e.g., initial density, current density, memory technology type, manufacturing information, etc.). In some arrangements, the control circuit 56 and the non-volatile semiconductor memory devices 58 of each memory module 24 reside on a common PCB 62 of that memory module 24 (e.g., see the memory module 24(2) in FIG. 2).

During operation, the CPU/processing circuitry 48 of the control module 26 is arranged to run an operating system 64 and appliance management applications 66 stored in the memory 46 of the control module 26. As a result, the control module 26 is capable of handling various maintenance and management tasks, e.g., configuration, normal operation, and status reporting, among other purposes. The interface 50 of the control module 26 is arranged to communicate with the external devices 44. By virtue of configuration information input into the main controller 52 at initial setup time, the main controller 52 understands a variety of characteristics regarding the memory modules 24, e.g., knows how to best protect the memory modules 24 from failure, knows how long (i.e., how many erase cycles) it takes for each memory module 24 to become unreliable, knows the speed of the memory modules 24, and so on. Furthermore, the main controller 52 is arranged to receive data access requests 68 from the external devices 44 through the interface 50, and carryout data storage operations 70 on the memory modules 24. To this end, the main controller 52 maps the memory space 60 to a logical memory space, and the main controller 52 manages data within that logical memory space. In particular, the main controller 52 stores data within and retrieves data from the non-volatile semiconductor memory of the memory modules 24 through the point-to-point connections 40 in a biased manner to unevenly wear out the memory modules 24 over time.

In some arrangements, both the memory modules 24 and the control modules 26 are provisioned as hot-swappable FRUs. This hot-swappability, in combination with module redundancy, enables the apparatus 20 to remain operational as a whole for high availability during replacement of any module (i.e., the apparatus 20 remains continuously responsive to data access requests 68 from the external devices 44). Further details of the overloading approach which is applied to the non-volatile semiconductor memory devices 58 will now be provided.

At the onset of operation, the control module 26 determines whether there is sufficient spare capacity in the system in order to use the uneven wear leveling method. If there is no space capacity, and the system is configured to maintain this capacity, the controller may operate in a wear leveling fashion as is standard in the art. However, if there is spare capacity in the system, so that a module may be replaced without the loss of capacity or performance, the control module 26 selects one of the memory modules 24 as the particular memory module 24 to be worn out first. If the memory modules 24 have a substantially even amount of wear up to this point (e.g., if all of the memory modules 24 are brand new), the control module 26 can arbitrarily choose one of the memory modules 24 to attack, e.g., the memory module 24(1) in FIG. 2. If the memory modules 24 do not have a substantially even amount of wear, the control module 26 selects the memory module 24 with the most wear, i.e., the memory module 24 that has performed the most erase cycles up to this point. The control module 26 is capable of tracking this wear information or alternatively querying this information from time to time from the memory modules 24.

Next, the control module 26 biases the writing of new data from the external devices 44 to the selected memory module 24. In particular, when the control module 26 receives a request to write new data to the logical memory space which maps to the memory space 60, the control module 26 preferably writes this new data to the selected memory module 24. If the control module 26 implements a particular RAID scheme, the module 26 further updates other memory modules 24 as necessary but preferably applies wear leveling to the remaining memory modules 24 which were not selected to be overloaded. For example, in a RAID level 5 implementation, the control module 26 further updates the memory module 24 which stores the parity data. As another example, in a RAID level 2 implementation having multiple mirrored pairs, the control module 26 preferably writes the new data to a pair of memory modules 24 which is selected as the pair to be worn out first (with other pairs of memory modules 24 being wear leveled among each other).

The above-described biasing approach for the apparatus 20 is, in some respects, opposite a conventional scheme of wear leveling which attempts to evenly distribute the writing of new data across all flash memory in order to evenly wear out the flash memory. In contrast to this conventional wear leveling scheme, the above-described wear biasing approach carried out by the control module 26 purposefully overloads, i.e., attacks, a selected memory module 24 (or selected mirrored pair of memory modules 24) in order to methodically wear out that selected memory module 24 ahead of the other memory modules 24.

A technique for determining when a memory module 24 is fully worn out will now be provided. As mentioned earlier, each memory module 24 is capable of carrying out only a finite number of erase cycles. Eventually, memory cells of the memory module 24 become incapable of being reliably erased and rewritten. To manage the condition of each memory module 24, the control circuit 56 of that memory module 24 maintains a current storage capacity value 72 indicating how many storage cells remain operable within the non-volatile semiconductor memory devices 58 of that memory module 24. Furthermore, during the course of use, the control circuit 56 of each memory module 24 informs the control module 26 of its current storage capacity value 72. In some arrangements, the control circuit 56 of each memory module 24 is capable of maintaining this current storage capacity value 72 internally, and reporting it the control module 26 in response to a query from the control module 26, in response to each operation performed on behalf of the control module 26, or periodically in response to a timer.

It should be understood that, as the capacities of the memory modules 24 change, the control module 26 with the help of the CPU/processing circuitry 48 remaps the lost space into other memory modules 24. Specifically, the control module 26 implements a strategy which unfairly wears out the selected memory module 24 so that the selected memory module 24 degrades faster over time due to the selected memory module 24 undergoing more erase cycles. That is, the current storage capacity value 72 of the most-written memory module 24 will drop the fastest due to the high frequency of erase cycles it is put through compared to the remaining memory modules 24 which are erased less often. As individual memory cells fail due to wearing out, the control module 26 nevertheless re-maps the logical memory space to new memory cells which preferably reside on the most-written memory module 24 to increase usage of that memory module 24.

As mentioned earlier, this strategy continues to be used until there is no longer sufficient space in the system to withstand another failed memory module 24. Once the total capacity of all the remaining memory modules 24 drops to a minimum acceptable capacity, the control module 26 with the help of the CPU/processing circuitry 48, reverts to a wear-leveling algorithm to preserve as much capacity for as long as possible until a service event introduces new spare capacity into the system by either replacing the failed memory modules 24 or installing additional memory modules 24.

If the current storage capacity value 72 of the memory module 24 exceeds a predefined capacity threshold 74 (e.g., stored in the memory 46), the control module 26 treats the memory module 24 as being an operable memory module, i.e., a memory module 24 that is available for write access. However, if the current storage capacity value 72 of the memory module 24 does not exceed the predefined capacity threshold 74 (e.g., 32 Gigabytes), the control module 26 treats the memory module 24 as being a non-operable memory module, i.e., a memory module 24 that is unavailable for write access, and outputs an electronic signal indicating that the memory module 24 must be replaced. For example, the control module 26 is capable of outputting a warning indication through the set of LEDs 32 of the failed memory module 24 marking that memory module 24 for replacement as well as sending out an automated phone call for servicing, an automated email, etc.

It should be understood that the above-described operation maximizes the useful life of the most-written memory module 24. In particular, the most-written memory module 24 is consumed to its fullest practical extent (i.e., used until it ultimately fails) in contrast to a conventional approach of discarding flash memory cards with residual useful life. Additionally, such operation naturally staggers the failure time of each memory module 24. That is, while the selected memory module 24 is overloaded, the remaining memory modules 24 are preferably balanced from an erase cycle perspective (i.e., wear leveled) and thus none of the remaining memory modules 24 is likely to fail concurrently with the most-written memory module 24. As a result, such operation decreases the likelihood of encountering multiple memory module failures prior to servicing.

It should be understood that the control module 26 was described above as using the current storage capacity value 72 of each memory module 24 as the criteria that determines whether the memory module 24 is still available for use. Other criteria may be suitable for use as well. For example, an alternative approach involves monitoring an erase cycle count 76 for each memory module 24, i.e., the control module 26 manages respective erase cycle counts 76 for each memory module 24 and increments a particular count 76 when it puts the corresponding memory module 24 through an erase cycle. Once the erase cycle count 76 for a memory module 24 exceeds a predefined number in which the memory module 24 is no longer reliable, the control module 26 treats that memory module 24 as being unavailable.

As another example, the control module 26 carries out detection of read errors by using an error correction code, such as Reed-Solomon or other BCH code. When the number of bits failing exceed a predetermined threshold, that portion of the memory module 24 is treated as being unavailable.

It should be further understood that the one or more of the memory modules 24 is capable of being set aside in a hot-standby manner. For example, suppose that the apparatus 20 includes six memory modules 24, with five of the memory modules 24 implementing a data protection scheme which utilizes striping and distributed parity (e.g., RAID level 5). Additionally, suppose that the sixth memory module 24 is unused but remains available in a hot-standby mode.

During operation, suppose that the control module 26 determines that one of the five memory modules 24 in the data protection scheme has failed due to wear, i.e., the earlier-selected most-written memory module 24 has finally worn out after a long period of operation. At this point, the control module 26 (i) selects one of the remaining four memory modules 24 to be written to most often in place of the failed memory module 24, and (ii) activates the hot-standby memory module 24 so that there are again five memory modules 24 implementing the data protection scheme.

Here, the control module 26 can perform a data recovery process. In some arrangements, the control module 26 re-maps the logical memory space to the new memory module 24 (i.e., to the former hot-standby memory module 24) and immediately populates the new memory module 24 with the data that was stored on the failed memory module 24. In other arrangements, the control module 26 populates the new memory module 24 with the data that was stored on the failed memory module 24 only in response to new operations which access the data. In these arrangements, the new memory module 24 is known to have little or no wear, so one of the other memory modules 24 will be selected to be worn out next. In yet other arrangements, the control module 26 populates the memory module 24 which has been newly selected as the memory module 24 to be worn out next in order to consume that newly selected memory module 24 as much as possible.

The control module 26 further signals for replacement of the failed memory module 24. Once the failed memory module 24 is replaced with a new memory module 24, that new memory module 24 becomes the hot-standby memory module 24.

At this point, it should be understood that the failed memory module 24 had been used to its fullest extent. Additionally, another memory module 24 is now selected to be the memory module to be written/erased most often and is expected to fail next. When this memory module 24 fails, the control module 24 selects another of the remaining original five memory modules 24 to be written most often, and activates the current hot-standby memory module 24. The remaining memory modules 24 which are not overloaded are wear leveled. This replacement process continues until all of the original five memory modules 24 have been consumed to their fullest extent and replaced with new memory modules 24 which were activated in a staggered fashion. Accordingly, subsequent failures due to wear out will continue to occur in a staggered manner with the newest memory module 24 expected to fail last.

It should be understood that, although the memory modules 24 not being selected as the one to be the one to fail next is described as wear leveled, they may alternatively also be unevenly worn so as to shorten the time to achieving the staggered remaining lifetime. In this alternative arrangement, upon the failure of the selected memory module 24, the next one to be selected will be the one closest to being worn out. Further details will now be provided with reference to FIG. 3.

Figure 3:
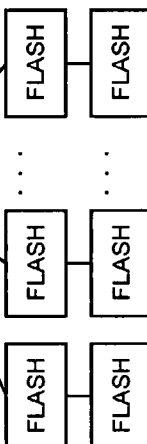
FIG. 3 is a block diagram illustrating a connection aspect of memory modules of the data storage apparatus of FIG. 1.

FIG. 3 is a block diagram of a portion of the data storage apparatus 20 from the perspective of a non-volatile semiconductor memory module 24, i.e., one of N memory modules 24. As mentioned earlier in connection with FIG. 2 and as further shown in FIG. 3, the memory module 24 connects to each control module 26 through the respective point-to-point connections 40. As a result, the external devices 44 (FIG. 2) have multiple paths to each memory module 24 thus enabling the data storage apparatus 20 to provide offer a high degree of availability, i.e., fault tolerance and load balancing.

In addition to the maximum redundancy and load balancing provided by the apparatus 20, it should be understood that there is no switching needed. Accordingly, connectivity is capable of being established directly between the control modules 26 and the memory modules 24 without any midplane (an otherwise potential single point of failure).

As mentioned earlier, the control circuits 56 buffer data on writes, and report failures and capacity changes to the control modules 26. In some arrangements, the control circuits 56 of the memory modules 24 present the memory modules 24 as flash memory cards in the style of advanced memory buffer (AMB) dual in-line memory modules (DIMMs).

It should be understood that all of the control modules 26 are arranged to bias erase cycles to the same memory module 24. That is, the control modules 26 coordinate their efforts in an organized and efficient manner. A variety of coordination control techniques are suitable for notifying all of the control modules 26 as to which memory module 24 is the selected module 24 to wear out first (e.g., preferably the most-worn memory module 24 at the time of selection). One suitable technique is for a user to manually select the memory module 24 to overload. Another technique is to use a master/slave approach in which a master control module 26 (or a backup control module 26 if the master becomes unavailable) selects the memory module 24. Yet another alternative is for the control modules 26 to reach an agreement for the order in a peer-to-peer manner.

In any of these arrangements, the control modules 26 methodically and reliably wear out the memory module 24 in an uneven manner. In particular, as the memory capacity of each memory module 24 diminishes over time, the control modules 26 work together to comprehensively re-map the logical memory space to unused memory locations. Eventually, the most-often written memory module 24 fails, and the control modules 26 select another memory module 24 to wear out. Over time, all of the memory modules 24 wear out in a staggered manner thus achieving maximum utilization of the memory modules 24 and incremental memory module replacement to minimize the likelihood of a multiple failure situation. Further details will now be provided with reference to FIG. 4.

Figure 4:
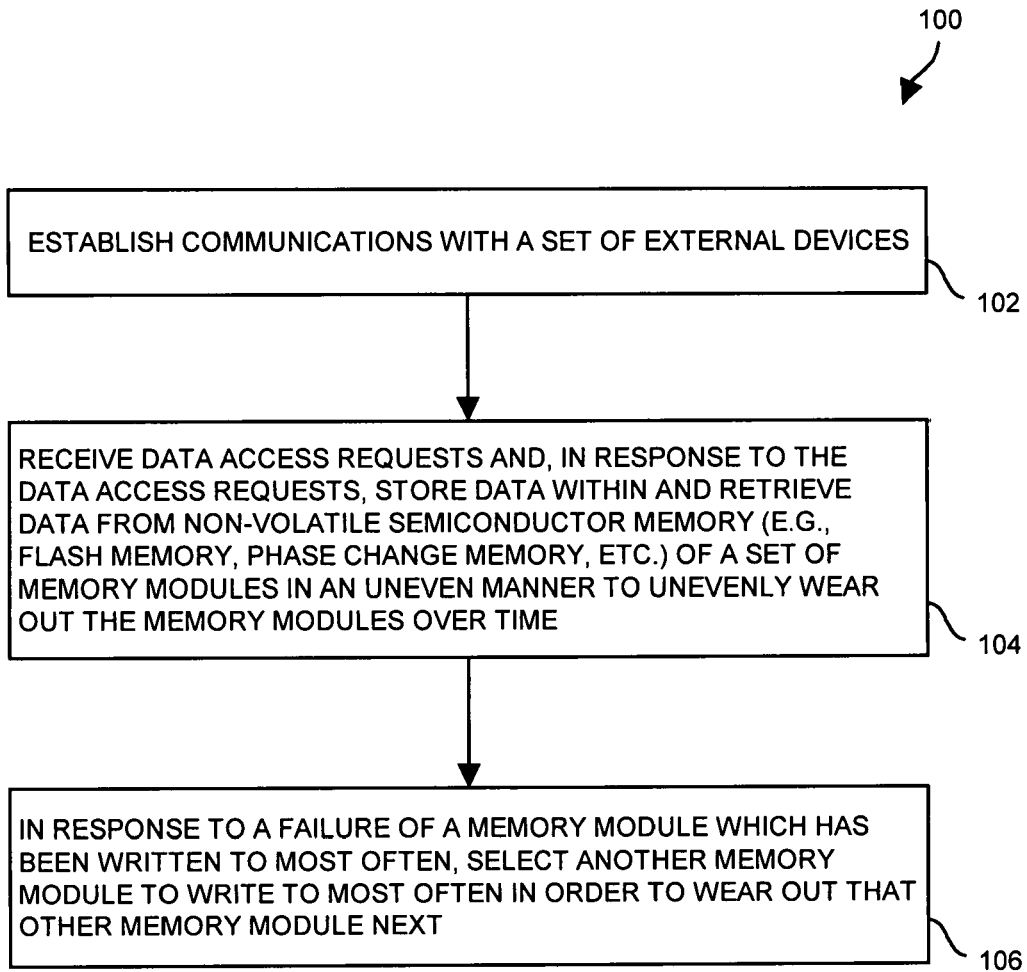
FIG. 4 is a flowchart of a procedure which is performed by a main controller of the data storage apparatus of FIG. 1.

FIG. 4 is a flowchart of a procedure 100 which is performed by a main controller 52 of a control module 26 of the data storage apparatus 20. In step 102, the main controller 52 establishes communications with a set of external devices 44 (also see FIG. 1). Accordingly, the external devices 44 are now able to provide data access requests 64 to the main controller 52.

In step 104, the main controller 52 receives the data access requests 64 and, in response to the requests 64, stores data within and retrieves data from non-volatile semiconductor memory of the memory modules 24 in an uneven manner to unevenly wear out the memory modules 24 over time. In particular, the main controller 52 biases writing of new data to a selected one of the memory modules 24. The main controller 52 wear levels remaining memory modules 24 that participate in data storage (e.g., the remaining RAID memory modules 24).

In step 106, the main controller 52 eventually detects failure of the selected memory module 24 due to putting that memory module 24 through erase cycles more often than the remaining memory modules 24. At this point, the main control 52 selects a new memory module 24 to which to bias writes most often. The failed memory module 52 is preferably replaced by a hot-standby memory module 24 and the main controller 52 remaps the logical memory space accordingly. Ultimately, a new hot-standby memory module 24 is put in place of the failed memory module 24. As mentioned earlier, such deliberate attacking of the memory modules 24 in an uneven manner results in maximization of memory module lifetime and lowering of the possibility of encountering multiple memory module failures prior to servicing. Further details will now be provided with reference to FIG. 5.

Figure 5:
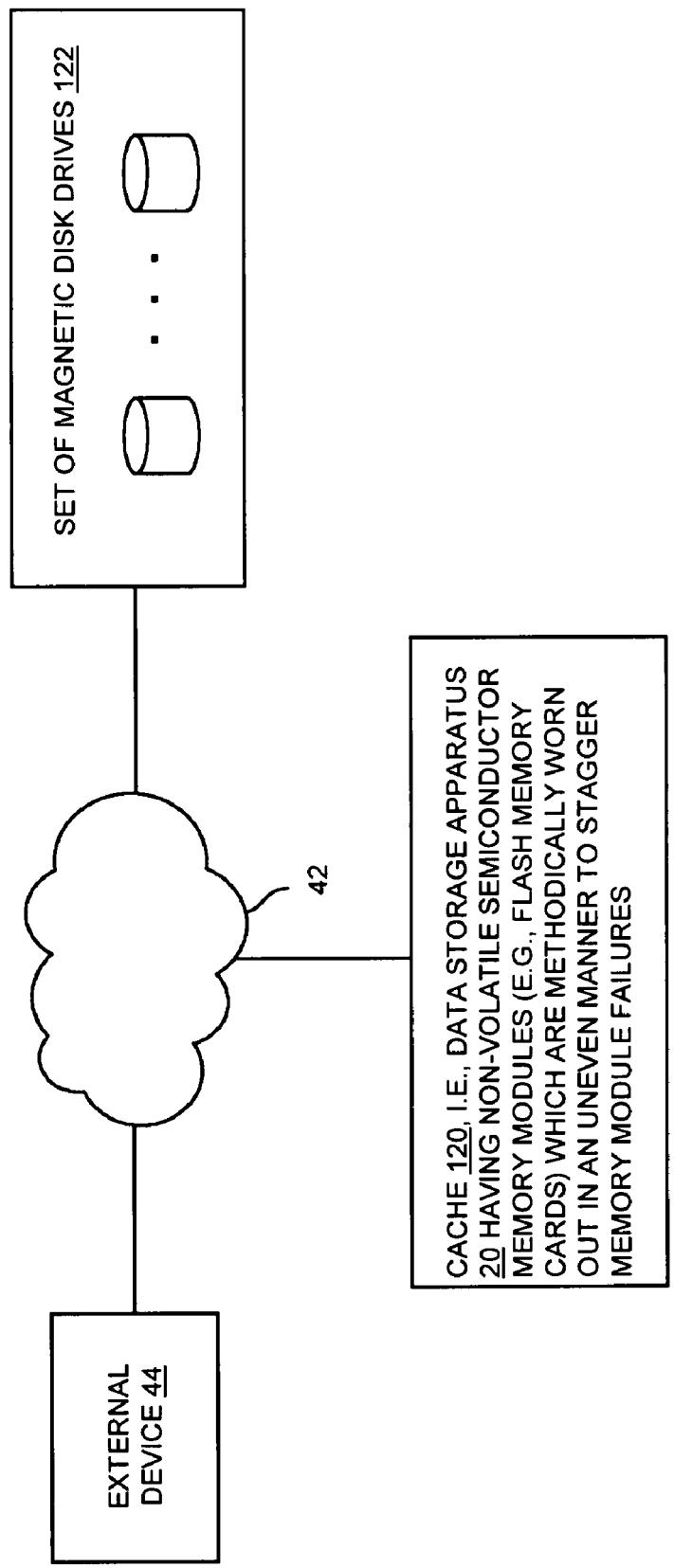
FIG. 5 is a block diagram of the data storage apparatus of FIG. 1 in the context of a data storage cache to an array of disk drives.

FIG. 5 is a block diagram of the data storage apparatus 20 in the context of a data storage cache to an array of disk drives. Here, the data storage apparatus 20 is arranged to operate as a cache 120 to a set of magnetic disk drives 122 (e.g., a disk drive array) in accordance with a write-back caching scheme. That is, the data storage apparatus 20 caches data written from the external device 44 en route to the magnetic disk drives 122. Such operation enables the external device 44 to have relatively quick subsequent access to the cached data in place of reading the data back from the magnetic disk drives 122. In addition to storage of data to the magnetic disk drives 122, the cache 120 is suitable for storing other information such as cyclic redundancy checking (CRC) values which are used to error check data. In some arrangements, the total capacity of the cache 120 is similar to the DRAM cache of a conventional data storage system (e.g., 128 GB, 256 GB, etc.).

In view of the relative low cost nature and access speed of flash memory, flash memory is particularly well-suited for the non-volatile semiconductor memory of the data storage appliance 20. Moreover, the use of flash memory consumes less power and has lower cooling requirements vis-à-vis DRAMs. Furthermore, the data within the data storage apparatus 20 is preserved in the event of power loss.

It should be understood that the interfaces 50 of the control modules 26 of the data storage apparatus 20 are capable of handling transactions using a variety of protocols (also see FIG. 2). Such protocols include Serial ATA, Fibre Channel, Rapid I/O, and InfiniBand®, among others. Moreover, a protocol such as InfiniBand makes the data storage apparatus 20 well suited as a standalone interface (i.e., not just a disk drive interface) for cluster applications (e.g., grid computer and multi-cluster environments, etc.).

As mentioned above, an improved technique involves purposefully accessing non-volatile semiconductor memory modules 24 in an uneven manner. In some arrangements, a controller 52 deliberately writes to the most-written non-volatile semiconductor memory module 24 most often in order to wear that memory module 24 out first. Accordingly, the non-volatile semiconductor memory modules 24 will decisively wear out unevenly over time (i.e., the most-written memory module 24 will clearly wear out ahead of the other memory modules 24). Moreover, such a technique enables each non-volatile semiconductor memory module 24 to be worn out to its fullest extent before replacement. Furthermore, such a technique staggers the expected failure of each non-volatile semiconductor memory module 24 to minimize the chance of encountering a situation of multiple memory module failures before servicing can arrive.

While various embodiments of the invention have been particularly shown and described, it will be understood by those skilled in the art that various changes in form and details may be made therein without departing from the spirit and scope of the invention as defined by the appended claims.

For example, the memory modules 24 were described above as being flash memory cards (e.g., SLC or MLC flash) which wear out after a finite number of erase cycles. It should be understood that the data storage apparatus 20 is capable of utilizing other types of non-volatile memory which wears out over time. Examples of suitable memory include STT RAM, MEMs, phase-change memory (i.e., PCM or PRAM), semiconductor-oxide-nitride-oxide semiconductor memory (i.e., SONOS or NVRAM), Resistive Random Access Memory (RRAM), Nano-RAM (NRAM), and the like.

It should also be understood that the memory modules 24 may employ volatile memories, such as DRAM, intermixed with non-volatile memory modules 24, where some the features of the control modules 26 are desired without the non-volatile capability. Furthermore, memory modules 24 which are DRAM or other non-wearing storage elements can be used by the control modules 26 to perform caching of write data to reduce the number of writes needed to the flash components provided that batteries, capacitance, or other charge storage is provided for power to the volatile elements in the event of a loss of system power. Additionally, the memory modules 24 may be other suitable storage modules, such as Flash-based Solid State Disks or standard rotating disk drives, that wear out according to use and may benefit from the uneven wear leveling scheme.

Additionally, it should be understood that the enclosure 22 was described above as being a rack-mount enclosure by way of example only. Other enclosure styles are suitable for use as well including electronic cabinets, towers, mini-towers, free-standing or integrated chassis, etc.

Furthermore, it should be understood that the control modules 26 preferably include memory as well. In some arrangements, this memory is used to cache writes and/or carryout prefetches. Such control module memory preferably has a backup power source (e.g., a battery, capacitance, etc.) to provide power in the event of a loss of main power, or alternatively stores data in a non-volatile manner.

What is claimed is:

1. A data storage apparatus, comprising:
a set of memory modules, each memory module of the set of memory modules having non-volatile semiconductor memory;
an interface arranged to communicate with a set of external devices; and
a main controller coupled to each memory module and to the interface, the main controller being arranged to (i) store data within and (ii) retrieve data from the non-volatile semiconductor memory of the set of memory modules in an uneven manner on behalf of the set of external devices to unevenly wear out the memory modules over time;
wherein the each memory module has, as the non-volatile semiconductor memory, flash memory;
wherein the main controller, when storing data within and retrieving data from the non-volatile semiconductor memory, is arranged to carry out data storage operations on a memory space formed by the flash memory; and
wherein the main controller is arranged to:
implement a data protection scheme which utilizes striping and parity across multiple memory modules of the set of memory modules, the multiple memory modules including a particular memory module, and
replace the particular memory module with a previously unused hot standby memory module when the current storage capacity value of the flash memory of the particular memory module transitions from being greater than a predefined capacity threshold to no longer being greater than the predefined capacity threshold.

2. A data storage apparatus as in claim 1 wherein the set of memory modules includes (i) a most-written memory module as the particular memory module, and (ii) remaining memory modules which have been written with data less often than the most-written memory module; and
wherein, prior to replacement of the particular memory module, the main controller is arranged to write new data from the set of external devices to the most-written memory module more often than to the remaining memory modules.

3. A data storage apparatus as in claim 2 wherein each memory module further has a control circuit coupled to the flash memory of that memory module, the control circuit being arranged to update a current storage capacity value of the flash memory of that memory module over time.

4. A data storage apparatus as in claim 3 wherein the main controller is further arranged to:
query the current storage capacity value of the flash memory of the particular memory module; and
treat the particular memory module as (i) an operable memory module when the current storage capacity value of the flash memory of the particular memory module exceeds the predefined capacity threshold, and (ii) a non-operable memory module when the current storage capacity value of the flash memory of the particular memory module does not exceed the predefined capacity threshold.

5. A data storage apparatus as in claim 4 wherein the main controller is further arranged to:
maintain a mapping of a logical memory space to the memory space formed by the flash memory; and
re-map the logical memory space in response to replacement of the particular memory module with the previously unused hot standby memory module.

6. A data storage apparatus as in claim 4 wherein the main controller is further arranged to:
monitor power consumption and temperature of the set of memory modules; and
provide a warning signal when at least one of (i) the power consumption of the set of memory modules falls outside a predetermined power range and (ii) the temperature of the set of memory modules falls outside a predetermined temperature range.

7. A data storage apparatus as in claim 4 wherein the main controller is further arranged to:
manage at least a portion of the memory space formed by the flash memory as a cache to a set of magnetic disk drives in accordance with a write-back caching scheme.

8. A data storage apparatus as in claim 2 wherein replacement of the particular memory module with the previously unused hot standby memory module includes decoupling the particular memory module from the main controller while maintaining coupling between the main controller and the remaining memory modules.

9. A data storage apparatus as in claim 1, further comprising:
another main controller coupled to each memory module, the other main controller being arranged to (i) store data within and (ii) retrieve data from the flash memory of the set of memory modules in an uneven manner on behalf of the set of external devices to unevenly wear out the memory modules over time.

10. A data storage apparatus as in claim 9, further comprising:
a rack-mount enclosure defining a front opening and a rear opening, each memory module being arranged to install within the rack-mount enclosure through the front opening, each main controller being arranged to install within the rack-mount enclosure through the rear opening; and
wherein operation of at least one main controller in combination with at least one memory module within the rack-mount enclosure forms a flash storage appliance.

11. A data storage apparatus as in claim 10 wherein each main controller and each memory module is arranged as a hot-pluggable field replaceable unit to enable the flash storage appliance to remain operational during replacement of any module.

12. A data storage apparatus as in claim 1 wherein the main controller is arranged to:
monitor a wear characteristic of each memory module of the set of memory modules, the wear characteristic identifying an amount of wear for that memory module.

13. A data storage apparatus as in claim 12 wherein the set of memory modules includes other memory modules, the particular memory module currently being the most-written memory module of the set of memory modules; and wherein the main controller is further arranged to:
receive new data to be stored in the set of memory modules from the set of external devices; and
store the new data more often on the particular memory module of the set of memory modules in response to the particular memory module having a wear characteristic indicating that the particular memory module currently is the most-written memory module of the set of memory modules.

14. A data storage apparatus as in claim 13 wherein the main controller is further arranged to:
monitor replacement of the particular memory module with the previously unused hot standby memory module, the previously unused hot standby memory module having a wear characteristic indicating that the previously unused hot standby memory module is not the most-written memory module of the set of memory modules;
receive additional new data to be stored in the set of memory modules from the set of external devices; and
store the additional new data more often on another memory module of the set of memory modules in response to the other memory module having a wear characteristic indicating that the other memory module is now the most-written memory module of the set of memory modules following replacement of the particular memory module.

15. A method of operating a data storage apparatus having a set of memory modules, each memory module having non-volatile semiconductor memory, the method comprising:
establishing communications with a set of external devices;
receiving data access requests from the set of external devices; and
in response to the data access requests, storing data within and retrieving data from the non-volatile semiconductor memory of the set of memory modules in an uneven manner on behalf of the set of external devices to unevenly wear out the memory modules over time;
wherein the each memory module has, as the non-volatile semiconductor memory, flash memory;
wherein storing the data within and retrieving the data from the non-volatile semiconductor memory, includes carrying out data storage operations on a memory space formed by the flash memory; and
wherein the method further comprises:
implementing a data protection scheme which utilizes striping and parity across multiple memory modules of the set of memory modules, the multiple memory modules including a particular memory module, and
replacing the particular memory module with a previously unused hot standby memory module when the current storage capacity value of the flash memory of the particular memory module transitions from being greater than a predefined capacity threshold to no longer being greater than the predefined capacity threshold.

16. A method as in claim 15 wherein the set of memory modules includes other memory modules, the particular memory module currently being the most-written memory module of the set of memory modules; and wherein the method further comprises:
writing new data from the set of external devices to the particular memory module more often than to the other memory modules in response to the particular memory module currently being the most-written memory module of the set of memory modules.

17. A method as in claim 16, further comprising:
monitoring replacement of the particular memory module with the previously unused hot standby memory module, the previously unused hot standby memory module currently not being the most-written memory module of the set of memory modules; and
writing additional new data from the set of external devices more often to one of the other memory modules in response to the one of the other memory modules currently being the most-written memory module of the set of memory modules following replacement of the particular memory module.

18. A method as in claim 16 wherein replacing the particular memory module with the previously unused hot standby memory module includes:
decoupling the particular memory module from a main controller while maintaining coupling between the main controller and the other memory modules.

19. A method as in claim 15, further comprising:
querying a current storage capacity value of the flash memory of the particular memory module; and
treating the particular memory module as (i) an operable memory module when the current storage capacity value of the flash memory of the particular memory module exceeds the predefined capacity threshold, and (ii) a non-operable memory module when the current storage capacity value of the flash memory of the particular memory module does not exceed the predefined capacity threshold.

20. A method as in claim 15, further comprising:
managing at least a portion of the memory space formed by the flash memory as a cache to a set of magnetic disk drives in accordance with a write-back caching scheme.

* * * * *